United States Patent
Divakaruni et al.

(10) Patent No.: US 6,790,722 B1
(45) Date of Patent: Sep. 14, 2004

(54) LOGIC SOI STRUCTURE, PROCESS AND APPLICATION FOR VERTICAL BIPOLAR TRANSISTOR

(75) Inventors: Ramachandra Divakaruni, Somers, NY (US); Russell J. Houghton, Essex Junction, VT (US); Jack A. Mandelman, Stormville, NY (US); Wilbur D. Pricer, Charlotte, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/718,850

(22) Filed: Nov. 22, 2000

(51) Int. Cl.$^7$ .................. H01L 21/8238; H01L 21/331; H01L 21/8222; H01L 21/8228
(52) U.S. Cl. .................. 438/202; 438/313; 438/311; 438/336; 438/321; 438/325; 438/378
(58) Field of Search ................ 438/202, 313, 438/311, 336, 321, 325, 378

(56) References Cited

U.S. PATENT DOCUMENTS

| | | | |
|---|---|---|---|
| 4,902,639 A | * 2/1990 | Ford | 438/207 |
| 5,087,580 A | 2/1992 | Eklund | |
| 5,279,978 A | 1/1994 | See et al. | |
| 5,352,624 A | 10/1994 | Miwa et al. | |
| 5,356,822 A | 10/1994 | Lin et al. | |
| 5,406,113 A | * 4/1995 | Horie | 257/505 |
| 5,446,312 A | 8/1995 | Hsieh et al. | |
| 5,541,120 A | 7/1996 | Robinson et al. | |
| 5,581,101 A | 12/1996 | Ning et al. | |
| 5,583,059 A | 12/1996 | Burghartz | |
| 5,587,599 A | 12/1996 | Mahnkopf et al. | |
| H1637 H | 3/1997 | Offord et al. | |
| 5,646,055 A | 7/1997 | Tsoi | |
| 5,744,855 A | * 4/1998 | Maki et al. | 257/370 |
| 5,849,613 A | 12/1998 | Peidous | |
| 5,851,864 A | 12/1998 | Ito et al. | |
| 5,904,536 A | * 5/1999 | Blair | 148/DIG. 10 |
| 6,001,700 A | * 12/1999 | Peidous | 438/309 |
| 6,037,664 A | * 3/2000 | Zhao et al. | 257/751 |
| 6,222,250 B1 | * 4/2001 | Gomi | 257/574 |
| 6,284,581 B1 | * 9/2001 | Pan et al. | 438/202 |

* cited by examiner

*Primary Examiner*—Eddie C. Lee
*Assistant Examiner*—Samuel A Gebremariam
(74) *Attorney, Agent, or Firm*—McGinn & Gibb, PLLC; Anthony Canale

(57) ABSTRACT

A method and structure for forming an emitter in a vertical bipolar transistor includes providing a substrate having a collector layer and a base layer over the collector layer, forming a patterning mask over the collector layer, and filling openings in the mask with emitter material in a damascene process. The CMOS/vertical bipolar structure has the collector, base regions, and emitter regions vertically disposed on one another, the collector region having a peak dopant concentration adjacent the inter-substrate isolation oxide.

19 Claims, 12 Drawing Sheets

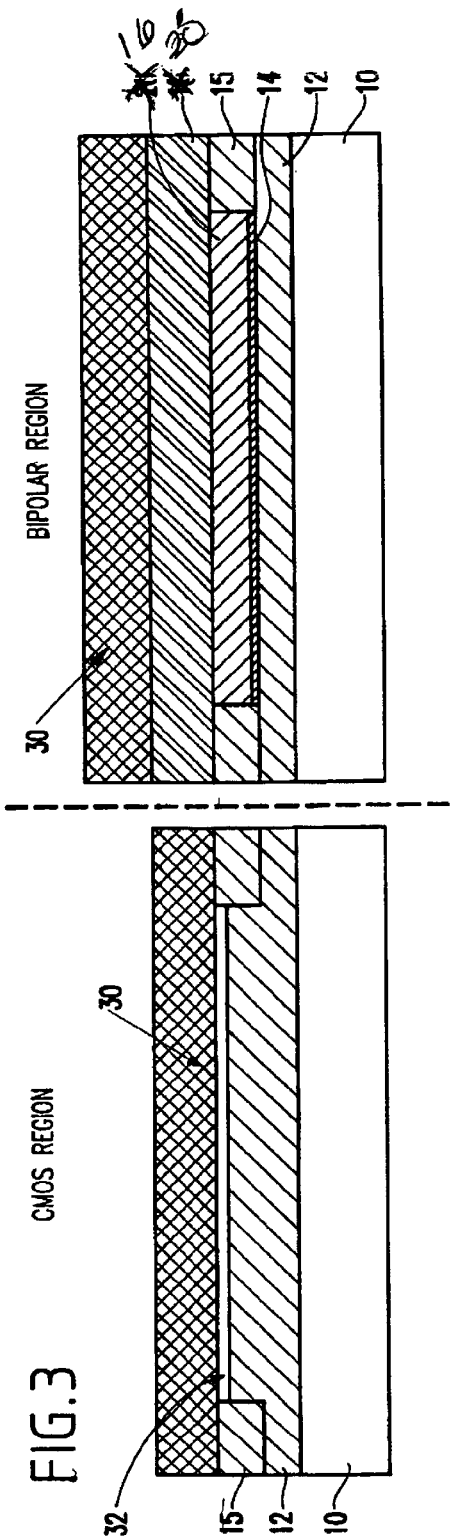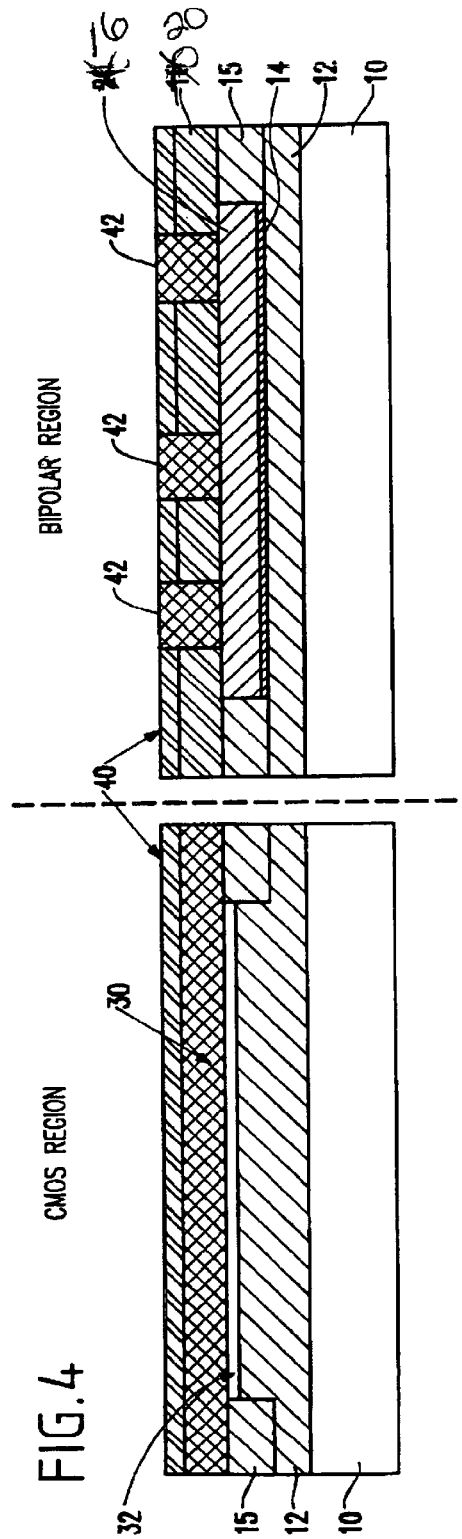

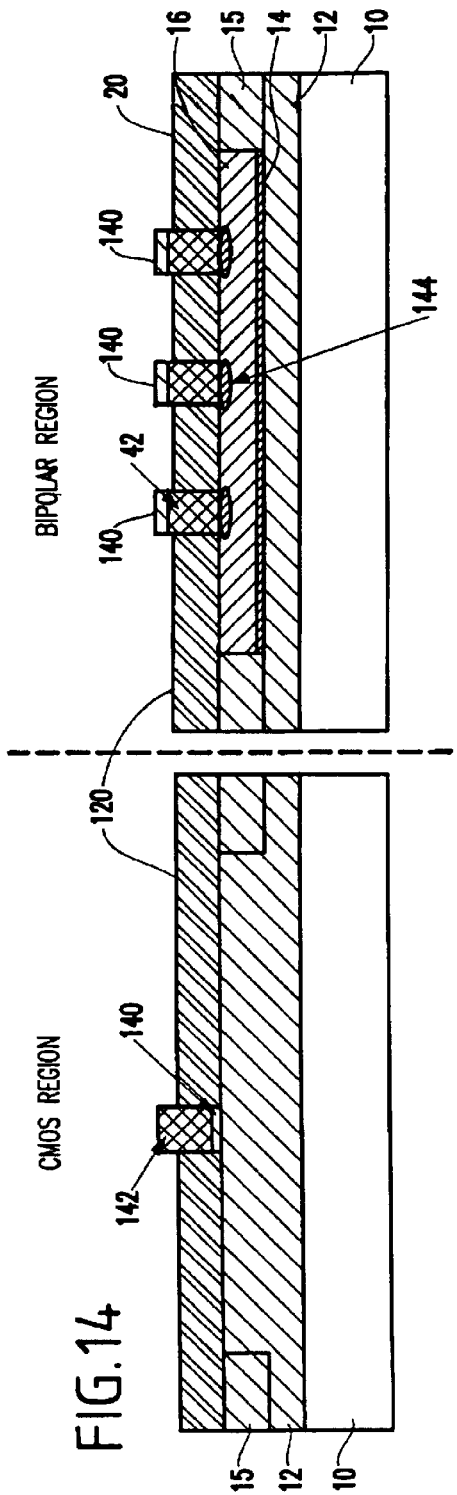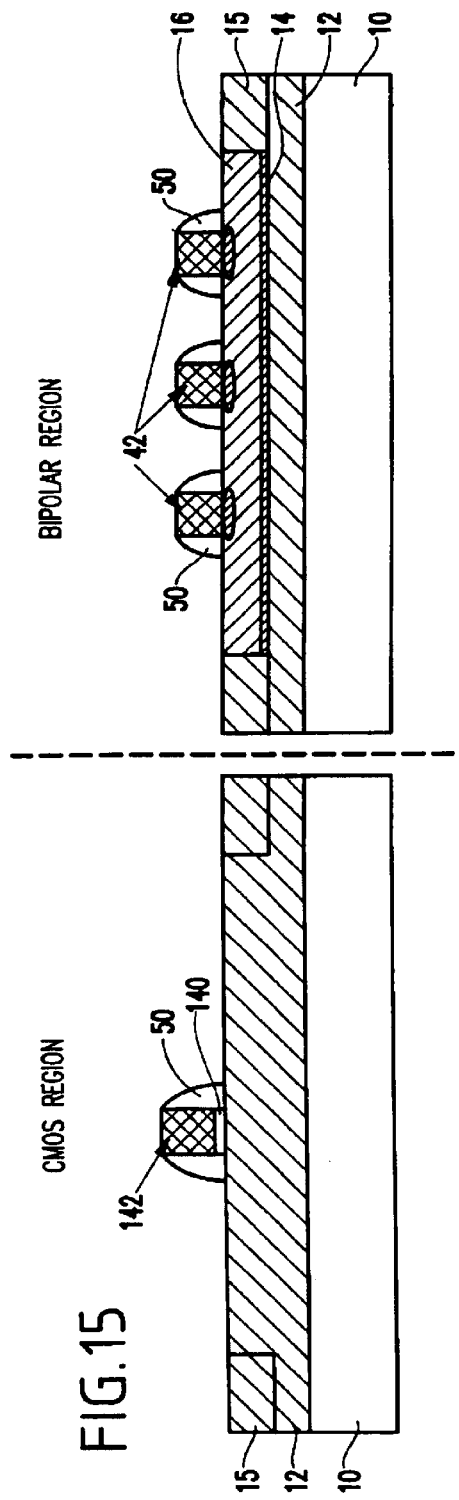

LOGIC SOI STRUCTURE, PROCESS AND APPLICATION FOR VERTICAL BIPOLAR TRANSISTOR

BACKGROUND OF THE INVENTION

1. Field of the Invention

The present invention generally relates to the formation of vertical bipolar transistors and more particularly to a method and process of forming vertical bipolar transistors simultaneously with field effect transistors using a damascene process.

2. Description of the Related Art

Silicon-On-Insulator (SOI) technology, which is becoming of increasing importance in the field of integrated circuits, deals with the formation of transistors in a relatively thin layer of semiconductor material overlying a layer of insulating material. Devices formed on SOI offer many advantages over their bulk counterparts, including: higher performance, absence of latch-up, higher packing density, low voltage applications, etc. SOI technology provides a very high performance regime for complementary metal oxide semiconductor (CMOS) operation due to a unique isolation structure.

It is advantageous in semiconductor manufacturing to simultaneously produce as many different types of devices on a chip as possible. Such simultaneous production reduce the number of steps and the amount of material required to make the chip. This reduces the time and cost of producing semiconductor chips. Therefore, it is desirable to simultaneously form different types of transistors on a single chip.

There is a conventional need to integrate a complementary pair of bipolar devices within the SOI CMOS framework for low voltage, high performance operation, thereby making use of as much of the SOI CMOS advantages as possible. The invention discussed below is directed to a methodology that simultaneously forms field effect transistors (e.g. CMOS transistors) and bipolar transistors using a damascene process to form the CMOS gates and the bipolar emitters.

SUMMARY OF THE INVENTION

It is, therefore, an object of the present invention to provide a structure and method of forming an emitter in a vertical bipolar transistor. The emitter forms a patterned mask over the collector layer and fills openings in the mask with emitter material in a damascene process. The substrate includes an insulator layer between a bottom silicon layer and a top silicon layer, and the invention implants a first impurity to form the collector layer in a lower portion of the top silicon layer adjacent the insulator layer, and a second impurity to form the base layer in an upper portion of the top silicon layer.

The emitter material includes a first impurity that is annealed to drive the first impurity into the base to create an emitter diffusion region in the base below each emitter. The substrate also includes a patterned second mask over the bipolar region, the mask includes openings through to the base layer between adjacent ones of the emitters, and the invention implants additional amounts of the second impurity into the base layer through the openings. The invention can also include forming a protective layer over the emitters and implanting additional amounts of the first impurity into the insulator layer to provide a collector contact diffusion region.

The invention also includes a method of simultaneously forming complementary methal oxide semiconductor devices and vertical bipolar transistors on an integrated circuit chip that includes providing a silicon over insulator substrate having a collector layer and a base layer over the collector; forming a polysilicon layer over a CMOS region of the SOI substrate, patterning a mask over the polysilicon layer and a bipolar region of the SOI substrate (the mask include openings over the bipolar region), depositing an emitter material in the openings in a damascene process to form emitters, removing the mask, patterning the polysilicon layer to form gate conductors, and forming sidewall spacers adjacent the emitters and the gate conductors.

The invention also includes a CMOS/vertical bipolar structure, in which the collector, base regions, and emitter regions are vertically disposed on one another, the collector region having a peak dopant concentration adjacent the inter-substrate isolation oxide.

BRIEF DESCRIPTION OF THE DRAWINGS

The foregoing and other objects, aspects and advantages will be better understood from the following detailed description of preferred embodiments of the invention with reference to the drawings, in which:

FIG. 3 is a cross-sectional schematic view of a stage of production of a CMOS transistor and a bipolar transistor;

FIG. 4 is a cross-sectional schematic view of a stage of production of a CMOS transistor and a bipolar transistor;

FIG. 14 is a cross-sectional schematic view of a stage of production of a CMOS transistor and a bipolar transistor;

FIG. 15 is a cross-sectional schematic view of a stage of production of a CMOS transistor and a bipolar transistor;

DETAILED DESCRIPTION OF PREFERRED EMBODIMENTS OF THE INVENTION

Figure 1:
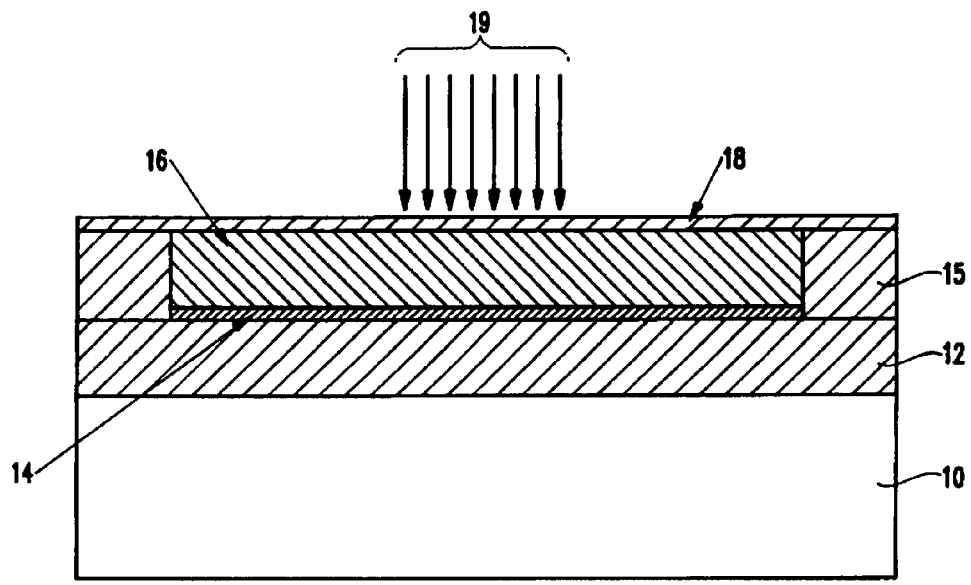
FIG. 1 is a cross-sectional schematic view of a stage of production of a bipolar transistor.

The invention takes advantage of SOI technology and simultaneously forms CMOS transistors and bipolar transistors utilizing a damascene process. More specifically, as shown in FIG. 1, the inventive process begins with a standard SOI structure. The structure includes a silicon substrate 10 (e.g. a bulk silicon) over which an insulator 12 (e.g., oxide layer) has been formed. A top silicon layer 15 is formed over the insulator 12.

The collector 14 (N+ collector) is formed through an implant process as represented by arrows 19. Antimony has been found to be a suitable N-type impurity because of its relatively low disffusivity and small implant straggle which enables the collector layer 14 to be confined near the back interface of the top silicon layer 15. Similarly, the P-type base 16 is formed by implants 19. FIG. 1 also illustrates a screen oxide 18 (such as a MOSFET screen oxide) is formed over the structure.

In one preferred embodiment, the SOI layer 10, 12, 15 could have a thickness of approximately 400 nm. The collector 14 implant 19 preferably has a dose of $1 \times 10^{16}$ cm$^{-2}$ at a power of 1M3V. This doping profile (and other similar doping profiles that would be known by those ordinarily skilled in the art given this disclosure) produces a buried collector 14 centered at approximately the back interface of the silicon 15 and insulator or 12 layers with a peak concentration of approximately $3 \times 10^{19}$ cm$^{-3}$.

Having the collector 14 and base 16 profiles vertically stacked results in an extremely narrow base width (Wb in FIG. 8), and a collector junction which terminates on the back oxide 12 of the SOI layer, meeting the device design objectives for high performance. The collector terminating on the back oxide reduces collector capacitance, thereby improving bipolar transistor performance. Further, the collector 14 and the base 16 are implanted with the same mask. This mask also protects the CMOS area of the wafer from receiving either implant.

Figure 2:
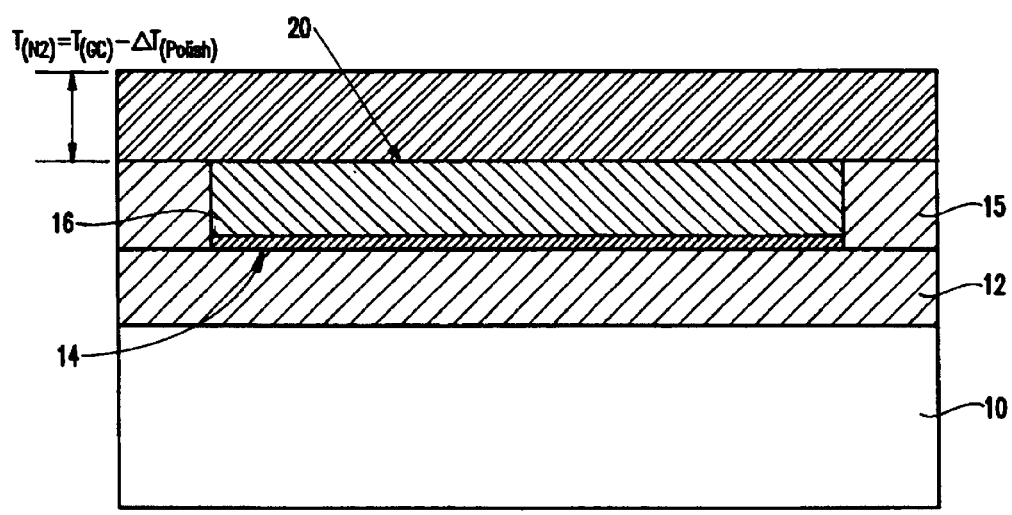
FIG. 2 is a cross-sectional schematic view of a stage of production of a bipolar transistor.

In FIG. 2, a thick nitride layer 20 is deposited over the bipolar and CMOS regions. The nitride is subsequently etched over the CMOS regions. The nitride layer 20 limits the gate oxidation to the CMOS regions. As shown below, the nitride layer 20 is used to damascene a bipolar emitter. The thickness of this nitride 20 is: $T_{(N2)}=T_{(GC)}-\Delta T_{(polish)}$ where: $T_{(n2)}$ is the thickness of the nitride deposited and is equal to the final desired gate conductor (GC) thickness (in the CMOS devices) minus a delta "physical" polish stop support nitride thickness (to be later deposited over the entire wafer to eliminate over-polish of GC only regions i.e., the CMOS region). $T_{(GC)}$ is the final desired GC thickness and $\Delta T_{(polish)}$ is the second nitride thickness required to form a polish stopping layer.

A photoresist mask (not shown) is used over the bipolar region to protect it from the CMOS device well implants. This mask is not additional, but rather it is simply a different mask having alternate blocking levels used to differentiate N-Well from P-Well areas. Therefore, the bipolar devices are protected from the CMOS device well implants without increasing the processing steps associated with standard processing.

FIG. 3 illustrates a CMOS device on the left side and a bipolar device on the right side as both would be simultaneously formed on a single wafer using the invention. The CMOS region includes the same SOI structure 10, 12, 15. In addition, a gate oxide 32 is formed within the CMOS region. The gate oxide 32 is not formed in the bipolar region by operation of the nitride mask 20. In FIG. 3 an intrinsic polysilicon 30 is formed over both structures.

FIG. 4 illustrates the formation of the bipolar transistor emitters 42. More specifically, the polysilicon 30 is removed from the bipolar region utilizing a mask or other protective structure to allow for the intrinsic polysilicon 30 to remain in the CMOS region. An additional nitride layer 40 is deposited over the entire wafer. Subsequently, openings are patterned through the nitride layers 40, 20 in the bipolar region and the openings are filled in a damascene process with an N+ doped polysilicon to form N+ polysilicon emitters 42. Then, the structure is polished to remove the nitride 40.

Figure 5:
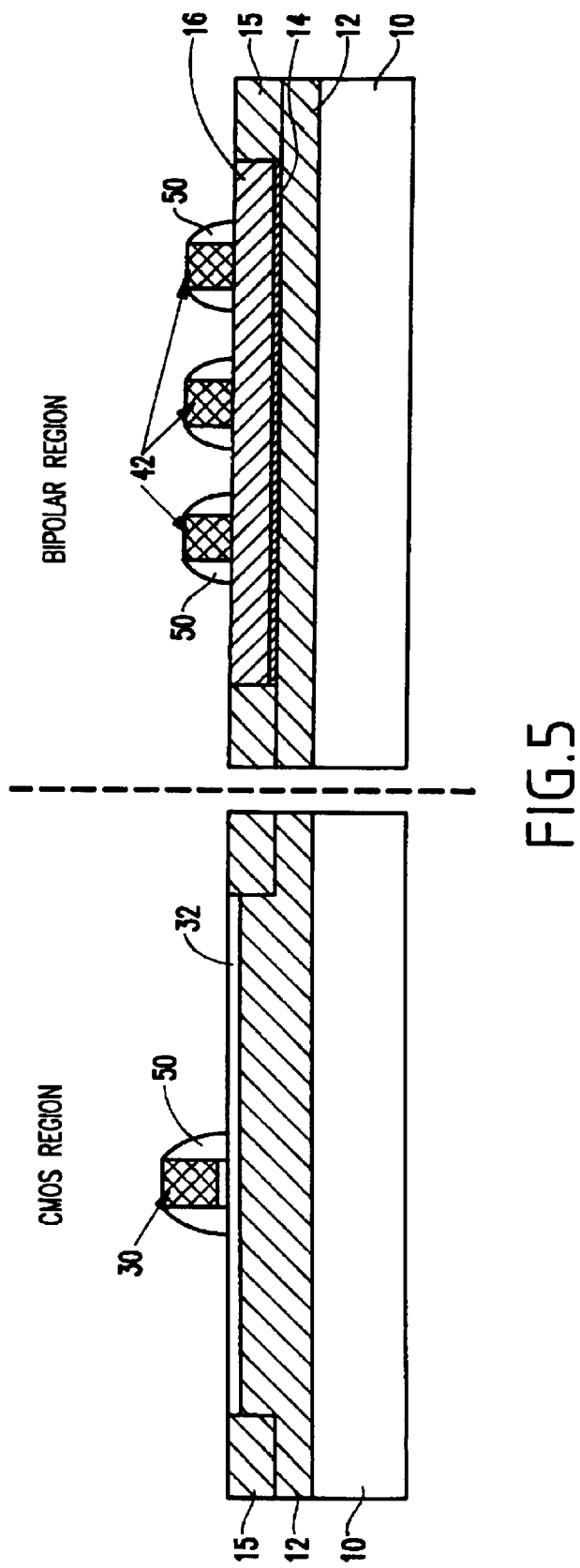
FIG. 5 is a cross-sectional schematic view of a stage of production of a CMOS transistor and a bipolar transistor.

As shown in FIG. 5, the nitride 20, 40 is removed. In a separate processing step, the polysilicon 30 remaining over the CMOS region is patterned into gates 30. The bipolar devices are protected by a mask during the patterning of the gates 30. Subsequently, sidewall spacers 50 are simultaneously formed over the gates 30 and the emitters 42, using any of a number of well-known sidewall spacer formation technologies.

Figure 6:
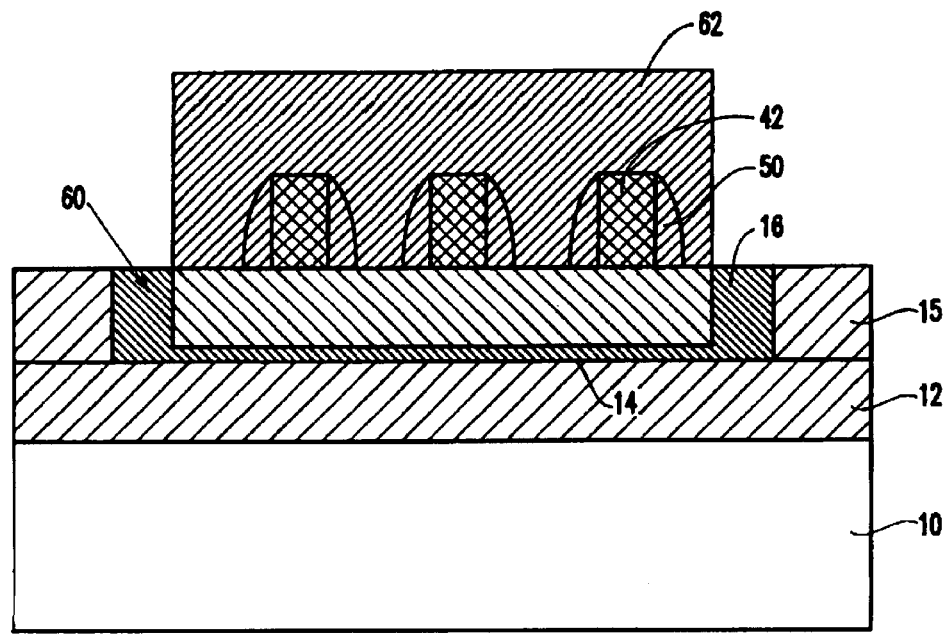
FIG. 6 is a cross-sectional schematic view of a stage of production of a bipolar transistor.

Next, in FIG. 6, a block mask 62 is formed over the emitters 42. This same mask protects PFET devices and exposes NFET junctions (not shown). An N+ implant is then performed to provide the N+ collector contact implant 60 and simultaneously dopes the source/drain structures of the NFETs (not shown).

Figure 7:
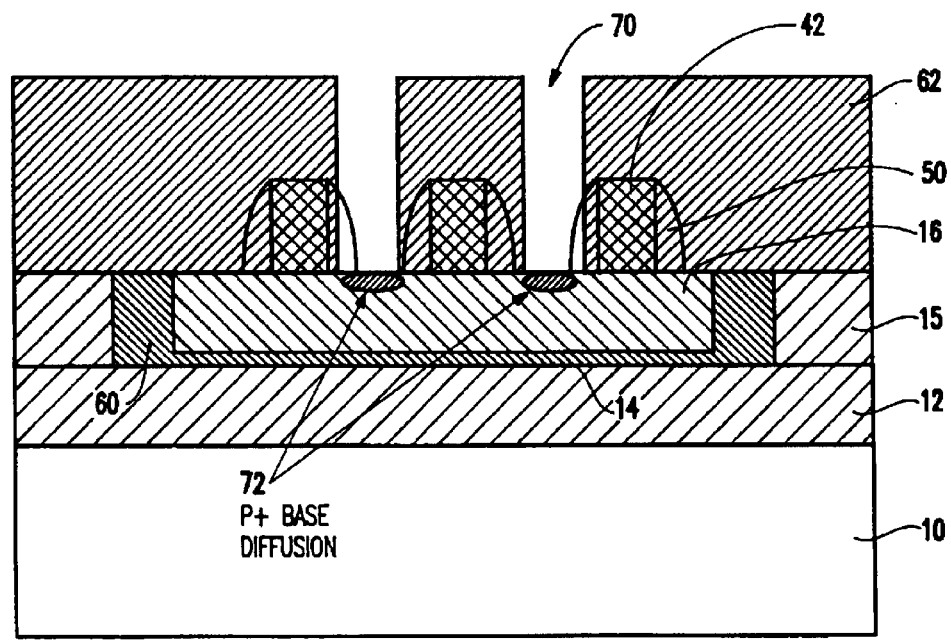
FIG. 7 is a cross-sectional schematic view of a stage of production of a bipolar transistor.

Openings 70 are patterned in the block mask 62 to allow the P+ diffusion implant 72 in the base 16, as shown in FIG. 7. In one embodiment, the P+ implant is a low energy high dose p-type implant. Such an implant would preferably be simultaneously performed with either a contact or extension implant in the parallel CMOS process. Alternatively, the P+ implant may be performed using an extra mask and implant if the particular SOI CMOS process does not utilize a similar contact or extension implant. The invention avoids using the PFET P+ junction implant in the CMOS process for the diffusion implant 72, as the P+ junction CMOS implant may reach through to the collector and destroy the functionality of the bipolar transistor.

Figure 8:
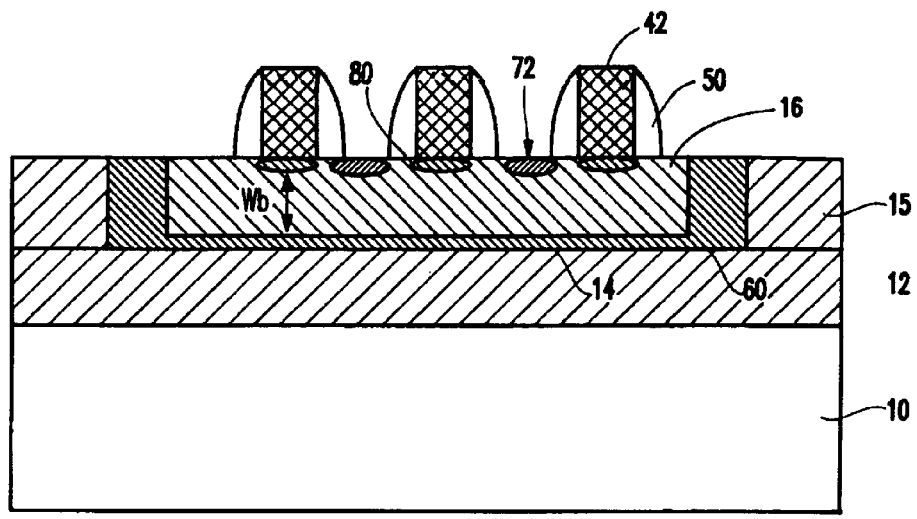
FIG. 8 is a cross-sectional schematic view of a completed bipolar transistor.

The block mask 62 is removed, as shown in FIG. 8. An annealing process drives the N+ 60, P+ 72 and emitter N+ 80 (from the N+ polysilicon 42) impurities into place, as shown in FIG. 8.

Figure 9:
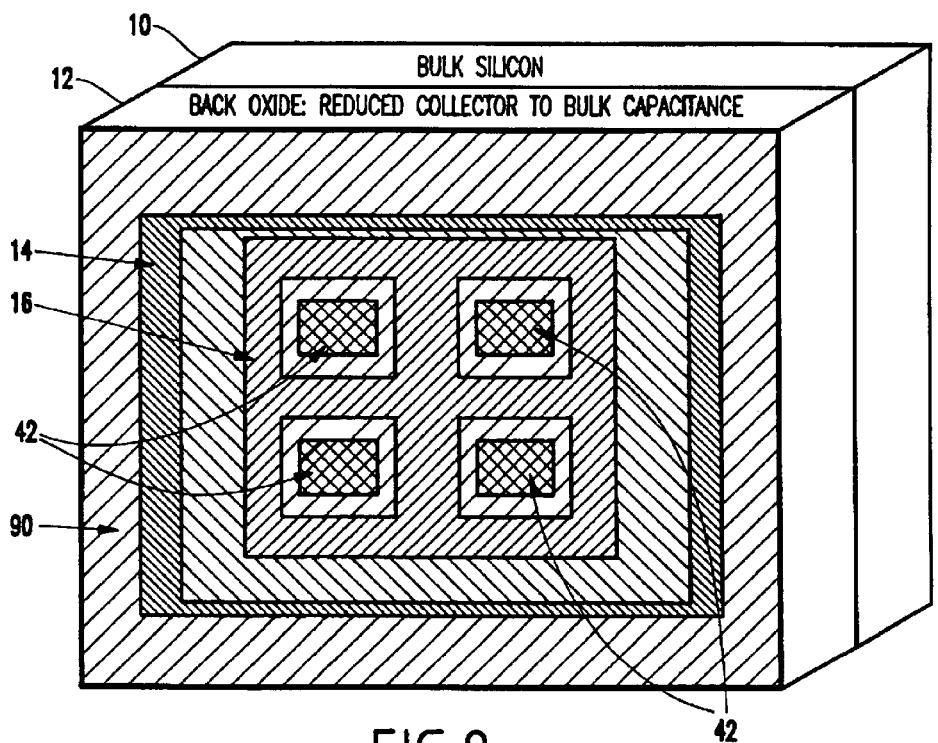
FIG. 9 is a perspective schematic view of bipolar transistors.

In FIGS. 8 and 9 the completed bipolar transistor is shown in cross section and perspective views as it might appear in a typical layout using multiple emitters 42. Contacts to the CMOS device and the vertical bipolar transistor are formed to this structure using conventional methods well known to those ordinarily skilled in the art. Such connections are not shown to not unnecessarily obscure the invention.

Figure 10B:
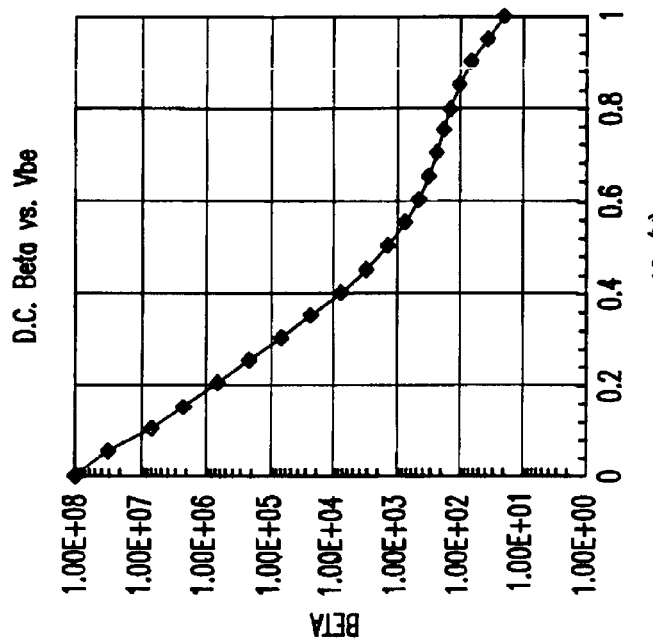
FIGS. 10A and 10B are graphs illustrating advantages produced by the invention.
Figure 10A:
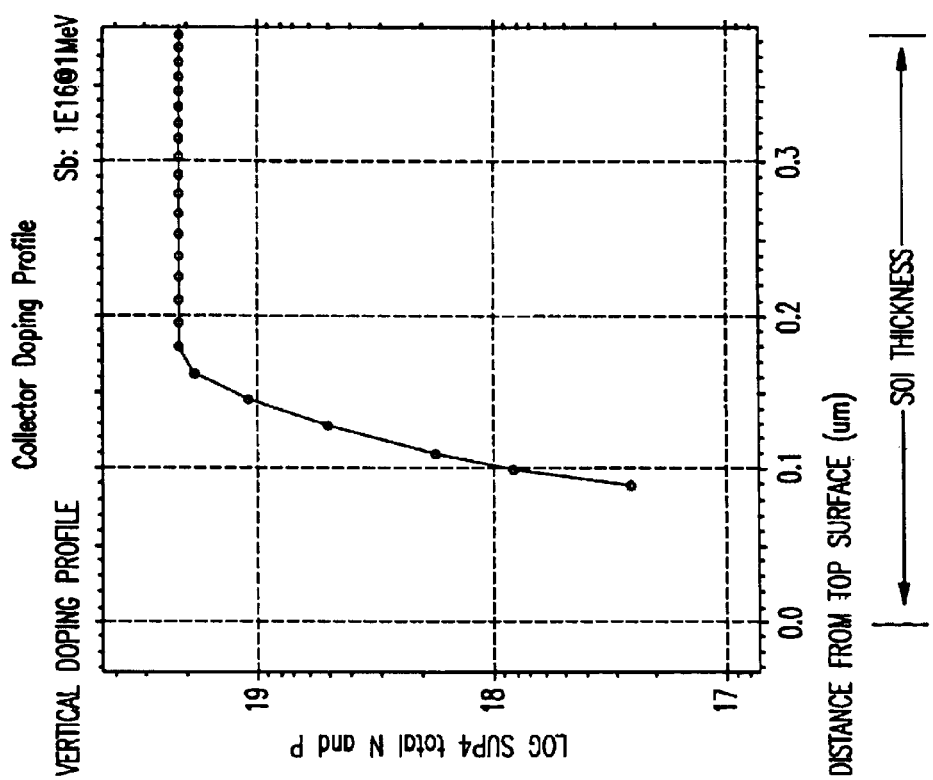

The collector doping profile and the D.C. performance of the device is shown in FIGS. 10A and 10B. The flat part of the collector doping profile shown in FIG. 10A lies in the interior of the collector region, which is adjacent to the back interface of the SOI layer. This plot shows the electrically active (as opposed to the chemical concentration) of the implanted antimony. The flat part of the profile in FIG. 10A is attributed to the low solid solubility of antimony in silicon and clustering effects.

The common emitter current gain (BETA, β) of the bipolar transistor, defined as $\Delta I_c/\Delta I_b$, is shown in FIG. 10B. The current gain decreases with increasing base-emitter voltage (vbe) due to effects resulting from the flooding of the base with carriers.

FIGS. 10A and 10B indicate the viability of a high performance bipolar device fabricated within the constraints of SOI processing. FIGS. 10A and 10B also show that the invention allows the base width Wb to be selectively controlled by either growing/depositing selective silicon over the top surface of the SOI layer.

FIGS. 11–20 illustrate a second embodiment of the invention. This embodiment is similar to the previous embodiment; However in this embodiment the gate conductors and the emitters are formed using damascene processes. The invention produces an integrated damascene (CMOS/bipolar process) reflecting all the advantages of damascene gate CMOS known in the art (i.e., the ability to provide channel doping away from source/drain which produces reduced junction capacitance, improved reliability). Therefore, the damascene emitter formation according to the invention represents a substantial improvement over existing technology.

Figure 11:
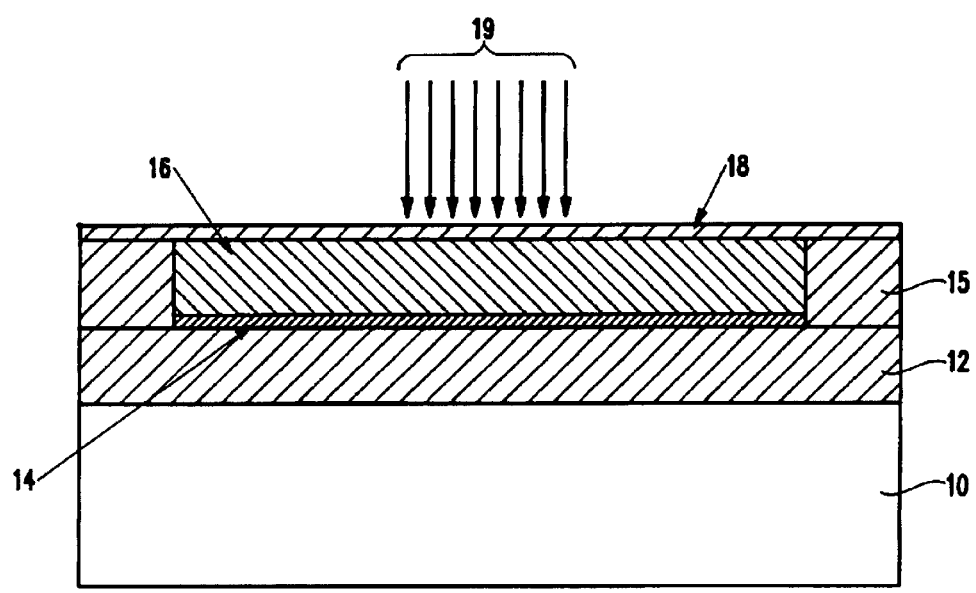
FIG. 11 is a cross-sectional schematic view of a stage of production of a bipolar transistor.
Figure 12:
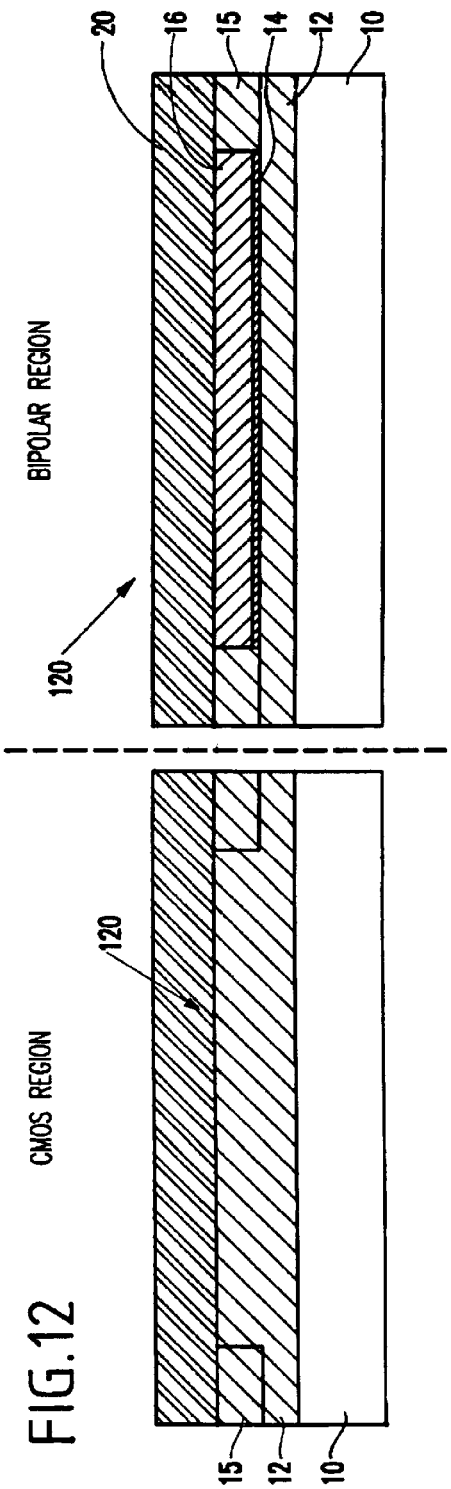
FIG. 12 is a cross-sectional schematic view of a stage of production of a CMOS transistor and a bipolar transistor.
Figure 13:
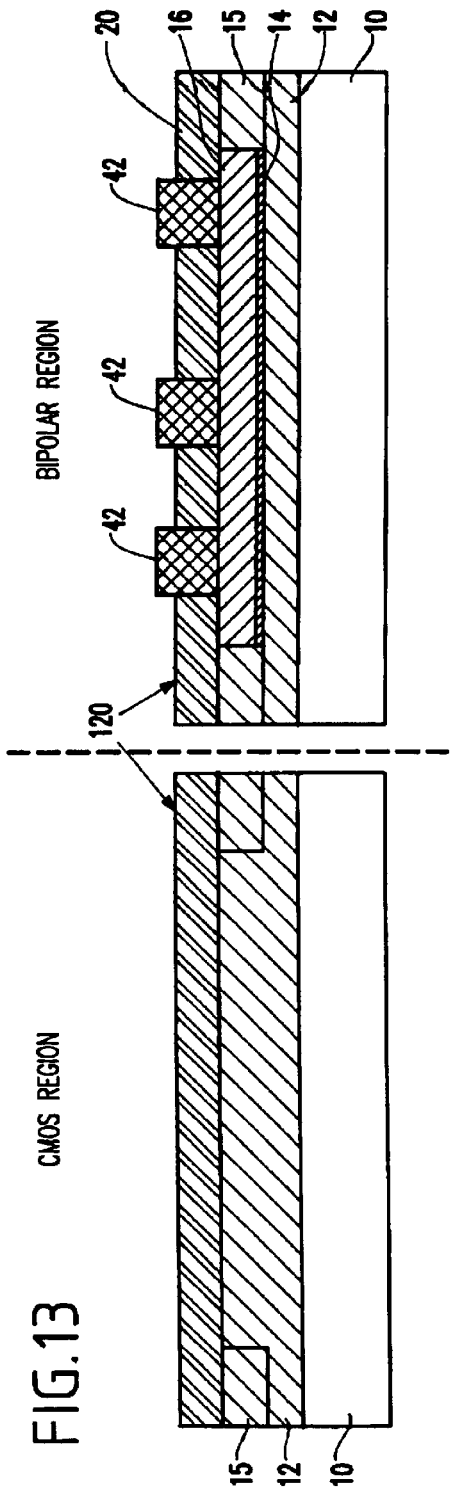
FIG. 13 is a cross-sectional schematic view of a stage of production of a CMOS transistor and a bipolar transistor.

Structures which are similar to those discussed above with respect to FIGS. 1–9 are identified with the same numbers in FIGS. 11–19 and a redundant discussion of the same is omitted for the sake of brevity. FIG. 11 is substantially similar to FIG. 1 and illustrates base and collector implants 19 being made to an SOI structure 10, 12, 15. In FIG. 12, a thick nitride layer 120 is deposited over the entire wafer. Then, in FIG. 13, openings for the emitters are formed in the bipolar region and the emitter conductors 42 (again, an N+ polysilicon) are deposited in a damascene process.

In FIG. 14, the gate conductors are formed by patterning openings through the thick nitride 120 in the CMOS region. Then, a gate oxide 140 is grown in the opening. Note that the gate oxide also forms over the emitters 42. Subsequently, the gate conductor 142 is formed in the remainder of the opening above the gate oxide 140. Note that the gate conductor 142 does not include a concentration of N+ doping (the gate poly is intrinsic) that the emitters 42 include. The N+ doping within the emitters 42 allows the emitter junction impurity 144 to be driven into the base 16 during subsequent annealing operations (which starts during the gate oxide 140 growth process).

Figure 16:
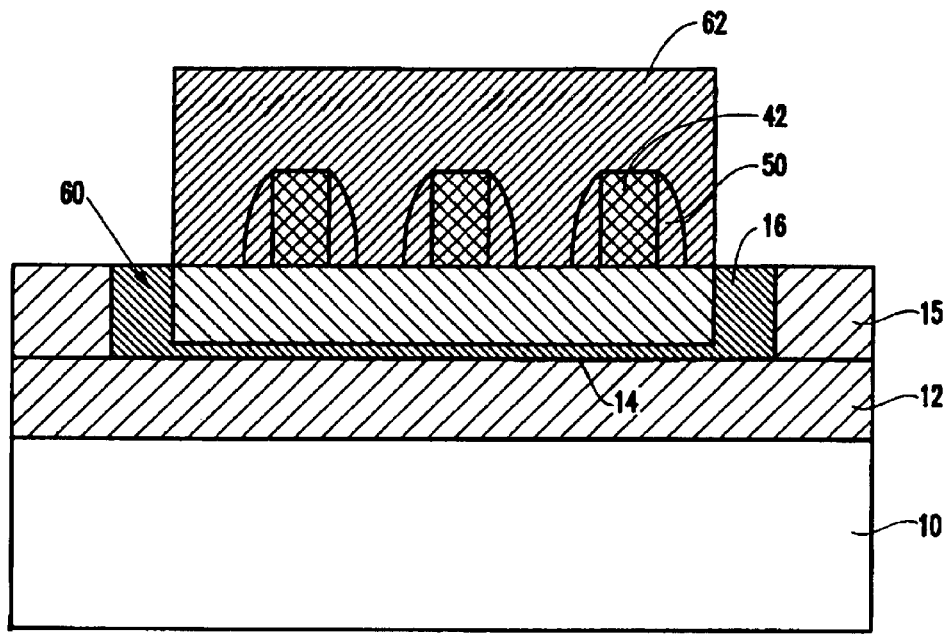
FIG. 16 is a cross-sectional schematic view of a stage of production of a bipolar transistor.
Figure 17:
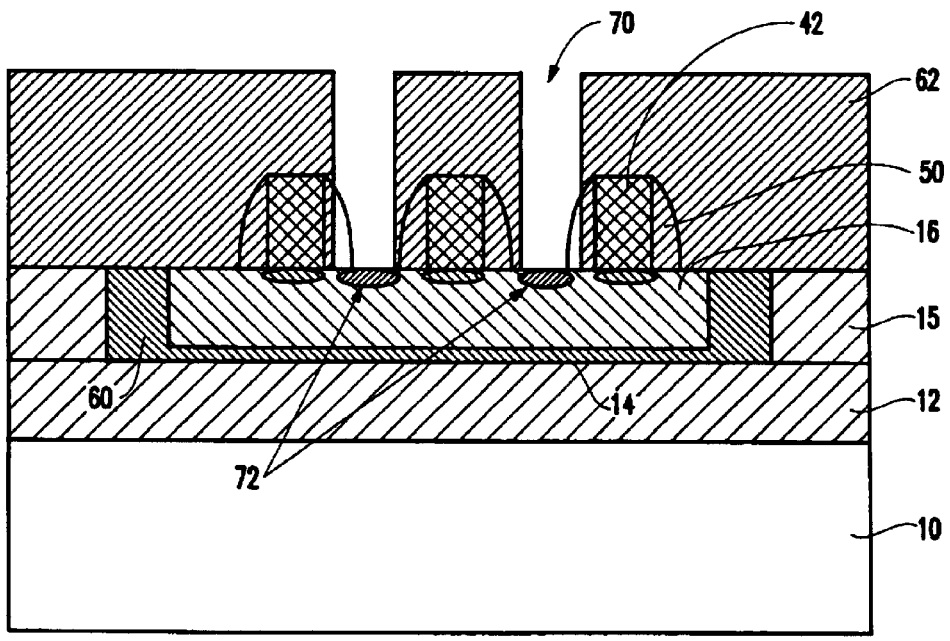
FIG. 17 is a cross-sectional schematic view of a stage of production of a bipolar transistor.
Figure 18:
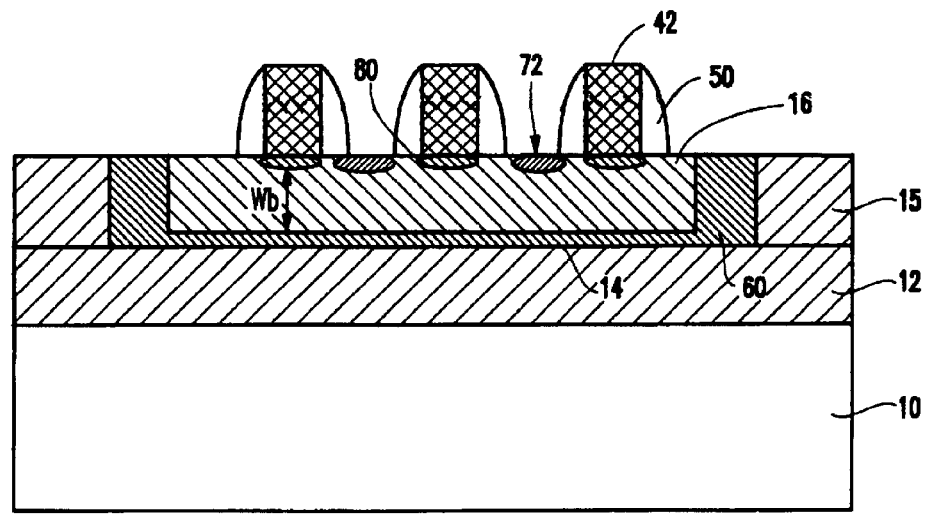
FIG. 18 is a cross-sectional schematic view of a completed bipolar transistor.
Figure 19:
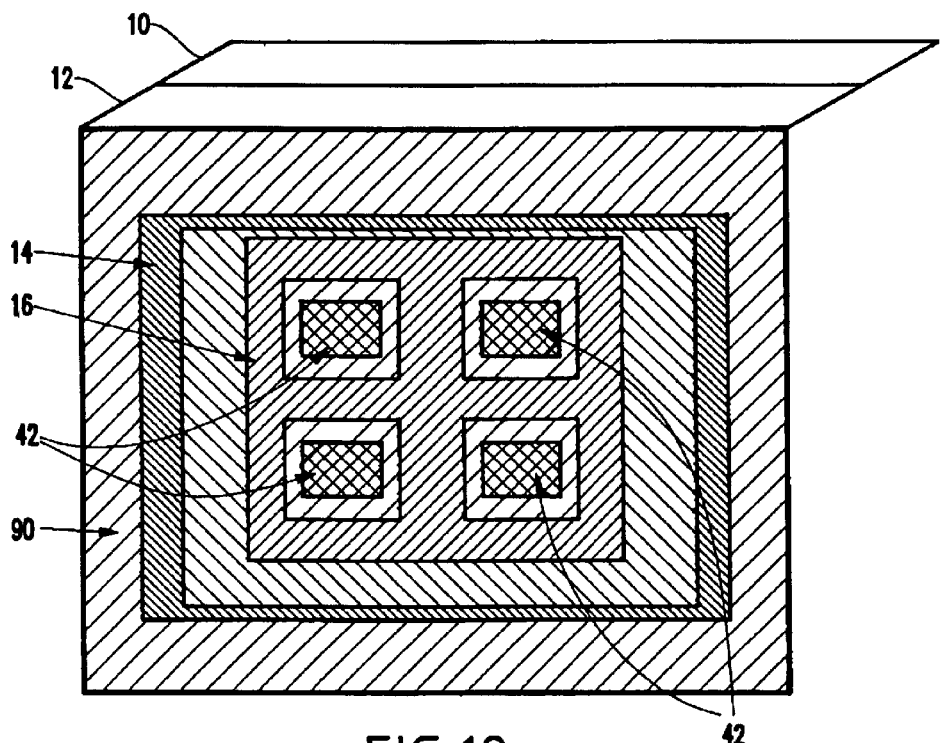
FIG. 19 is a perspective schematic view of bipolar transistors.

FIG. 15 illustrates formation of the spacers 50, as discussed above with respect to FIG. 5. Similarly, FIG. 16 illustrates the formation of the block mask 62 and the collector contact diffusion 60 in a similar process to that discussed above with respect to FIG. 6. In FIG. 17, openings 70 are again formed in the block mask 62 and the base diffusion implant is performed, in a process similar to that discussed above with respect to FIG. 7. In a similar manner to that discussed above with respect to FIGS. 8 and 9, FIGS. 18 and 19 illustrate the activation of the N+, P+ and emitter drive-in anneals 60, 72, 80.

Figures 20A, 20B:
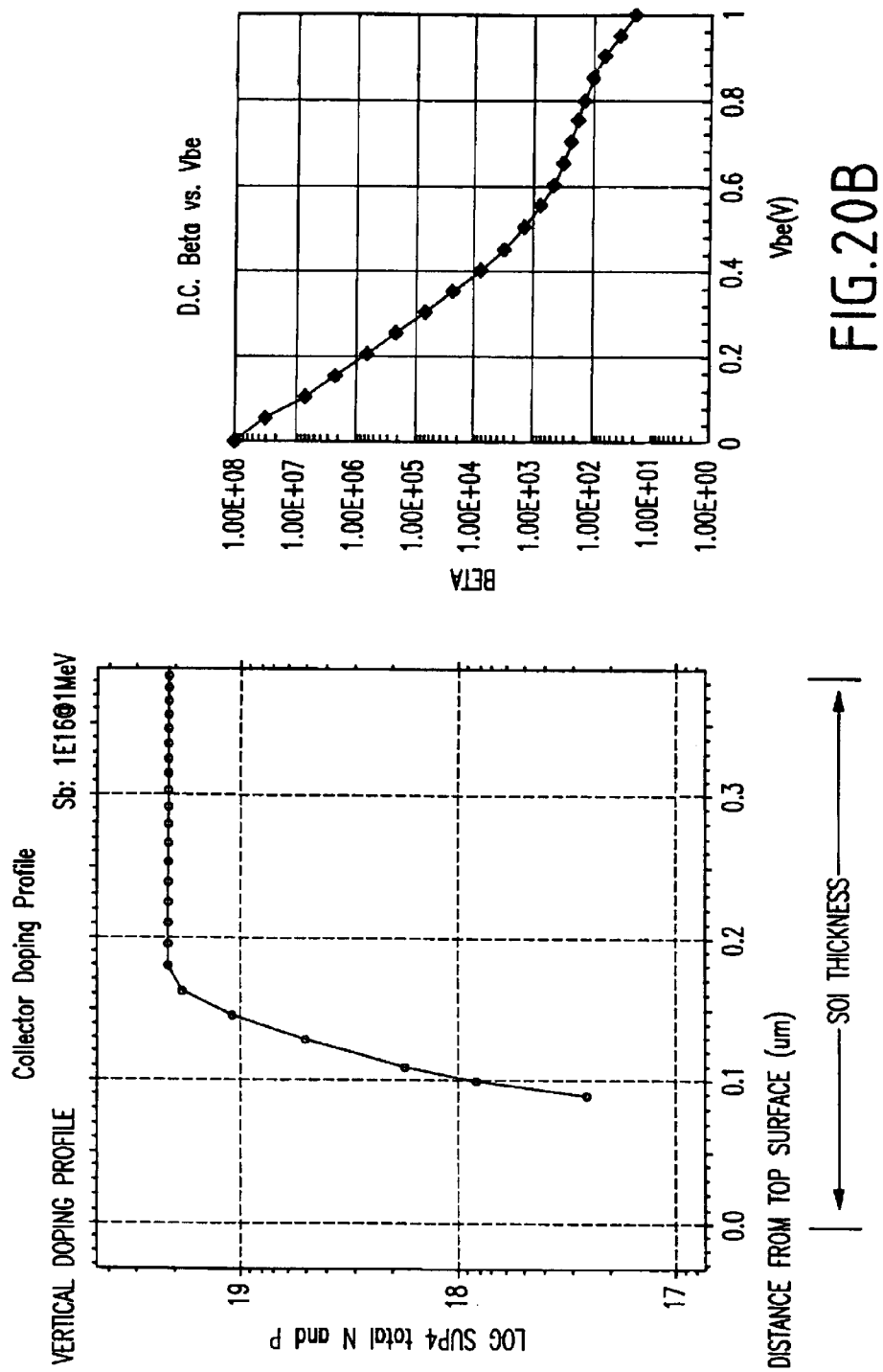
FIGS. 20A and 20B are graphs illustrating advantages produced by the invention.

FIGS. 20A–20B illustrate the performance achieved through this embodiment of the invention.

As discussed above, the invention includes fabrication sequences for a vertical SOI bipolar transistor, which is integrated into a typical logic process sequence. An NPN sequence is illustrated, but as would be known by one ordinarily skilled in the art given this disclosure, the invention can be easily modified to accommodate a PNP, thus offering a complementary pair.

In drawing a parallel to a CMOS fully depleted body, the inventive bipolar device is orientated vertically (see FIG. 8) in SOI and has a base width Wb which is independent of the SOI thickness, and hence is very narrow. Since the charge of excess minority carriers in the base ($\Delta Q$) is proportional to the base width Wb, and the base transit time, $\tau b$ is proportional to $\Delta Q$, the SOI effect on bipolar performance is scaled with the CMOS improvement.

Another improvement in bipolar performance arises from the reduced collector to substrate capacitance achieved with the invention as compared to a pure silicon vertical structure. In SOI CMOS, the P/N junction area capacitance term is negligible as the junction terminates on the back oxide. The vertical NPN structure shown in FIG. 8 takes advantage of this same design improvement for bipolar devices.

Applications for the inventive technology cover the spectrum from pure digital applications such as DRAM, eDRAM, SRAM, MRs to mixed-mode combined RF/digital applications such as communications products. This technology enables the concurrent use of high-performance CMOS digital logic and high-performance bipolar analog small signal circuitry on the same chip.

While the invention has been described in terms of preferred embodiments, those skilled in the art will recognize that the invention can be practiced with modification within the spirit and scope of the appended claims.

What is claimed is:

1. A method of forming an emitter in a vertical bipolar transistor comprising:

providing a substrate;

forming a uniformly thick oxide layer over said substrate;

performing multiple implants through a single mask to form a base layer over a collector layer within said substrate;

forming a patterned mask over said base layer; and filling openings in said mask with emitter material in a damascene process, said emitter material contacting the substrate.

2. The method in claim 1, wherein said substrate includes an insulator layer between a bottom silicon layer and a top silicon layer, said method further comprising:

implanting a first impurity to form said collector layer in a lower portion of said top silicon layer adjacent said insulator layer; and implanting a second impurity to form said base layer in an upper portion of said top silicon layer.

3. The method in claim 2, wherein said emitting material includes said first impurity and said method further comprises annealing said vertical bipolar transistor to drive said first impurity into said base to create an emitter diffusion region in said base below each emitter.

4. The method in claim 2, further comprising:

patterning a second mask over said bipolar region, said mask including openings through to said base layer between adjacent ones of said emitters; and implanting additional amounts of said second impurity into said base layer through said openings.

5. The method in claim 2, further comprising:

forming a protective layer over said emitters; and implanting additional amounts of said first impurity into and through said insulator layer to provide a collector contact diffusion region.

6. A method of simultaneously forming complementary metal oxide semiconductor (CMOS) devices and vertical bipolar transistors on an integrated circuit chip comprising:

providing a substrate;

forming a uniformly thick oxide layer over said substrate;

performing multiple implants through a single mask to form a base layer over a collector layer within said substrate;

forming a gate oxide layer over only said CMOS region of said SOI substrate;

forming a polysilicon layer over a CMOS region of said SOI substrate;

patterning a mask over said polysilicon layer and a bipolar region of said SOI substrate, said mask including openings over said bipolar region depositing an emitter material in said openings in a damascene process to form emitters;

removing said mask;

pattering said polysilicon layer to form gate conductors; and forming sidewall spacers adjacent said emitters and said gate conductors.

7. The method in claim 6, wherein said substrate includes an insulator layer between a bottom silicon layer and a top silicon layer, said method further comprising:

implanting a first impurity to form said collector layer in a lower portion of said top silicon layer adjacent said insulator layer; and implanting a second impurity to form said base layer in an upper portion of said top silicon layer.

8. The method in claim 7, wherein said emitter material includes said first impurity and said method further comprises annealing said vertical bipolar transistor to drive said first impurity into said base to create an emitter division region in said base below each emitter.

9. The method in claim 7, further comprising:

patterning a second mask over said bipolar region, said mask including second openings through to said base layer between adjacent ones of said emitters; and implanting additional amounts of said second impurity into said base layer through said openings.

10. The method in claim 7, further comprising:

forming a protective layer over said emitters; and implanting additional amounts of said first impurity into and through said insulator layer to provide a collector contact diffusion region.

11. A method of simultaneously forming complementary metal oxide semiconductor (CMOS) devices and vertical bipolar transistors on an integrated circuit chip comprising:

providing a substrate;

forming a uniformly thick oxide layer over said substrate;

performing multiple implants through a single mask to form a base layer over a collector layer within said substrate;

patterning a mask over a CMOS region and a bipolar region of said SOI substrate, said mask including first openings over said bipolar region;

depositing an emitter material in said first opening in a first damascene process to form emitters, said emitters contacting said SOI substrate;

patterning said mask to form second openings over said CMOS region;

depositing a gate conductor material in said second opening in a second damascene process to form gate conductors;

removing said mask; and forming sidewall spacers adjacent said emitters and said gate conductors.

12. A method of simultaneously forming complementary metal oxide semiconductor (CMOS) devices and vertical bipolar transistors on an integrated circuit chip comprising:

providing a substrate;

forming a uniformly thick oxide layer over said substrate;

performing multiple implants through a single mask to form a base layer over a collector layer within said substrate;

patterning a mask over a CMOS region and a bipolar region of said SOI substrate, said mask including first openings over said bipolar region;

depositing an emitter material in said first openings in a first damascene process to form emitters, said emitters contacting said SOI substrate;

patterning said mask to form second openings over said CMOS region;

depositing a gate conductor material in said second opening in a second damascene process to form gate conductors;

removing said mask; and forming sidewall spacers adjacent said emitters and said gate conductors, wherein said emitter material includes said first impurity and said method further comprises annealing said vertical bipolar transistor to drive said first impurity into said base to create an emitter diffusion region in said base below each emitter.

13. The method in claim 12, wherein said substrate includes an insulator layer between a bottom silicon layer and a top silicon layer, said method further comprising:

implanting a first impurity to form said collector layer in a lower portion of said top silicon layer adjacent said insulator layer; and implanting a second impurity to form said base layer in an upper portion of said top silicon layer.

14. The method in claim 13, further comprising:

patterning a second mask over said bipolar region, said mask including third openings through to said base layer between adjacent ones of said emitters; and implanting additional amounts of said second impurity into said base layer through said third openings.

15. The method in claim 13, further comprising:

forming a protective layer over said emitters; and implanting additional amounts of said first impurity into and through said insulator layer to provide a collector contact diffusion region.

16. The method in claim 12, further comprising before said forming of said polysilicon, forming a gate oxide layer over only said CMOS region of said SOI substrate.

17. A method of forming a bipolar device on a SOI substrate having a semiconductor layer overlying a buried insulator layer to form an interface where a surface of the semiconductor layer is adjacent to a surface of the buried insulator layer, comprising the steps of:

forming a uniformly thick oxide layer over said substrate;

forming in said semiconductor layer a buried collector region through a single mask, wherein said buried collector region is centered at approximately said interface; and forming in said semiconductor layer a base region through said single mask, wherein said base region is vertically stacked on said buried collector region, wherein said buried collector region and said base region are formed by implantation through said single mask formed on the SOI substrate.

18. The method of claim 17, wherein said buried collector region and said base region are formed by implantation through a single mask formed on the SOI substrate.

19. The method of claim 17, further comprising:

forming a mask having openings on the SOI substrate;

depositing an emitter material contacting the SOI substrate having a first impurity in said openings in a damacene process to form emitters; and annealing the SOI substrate to drive said first impurity into said base region to create an emitter diffusion region in said base region below each emitter.

* * * * *